United States Patent
Lozhkin

(10) Patent No.: US 8,605,819 B2
(45) Date of Patent: Dec. 10, 2013

(54) MEMORY EFFECT CANCELLER, TRANSMITTER, AND MEMORY EFFECT CANCELLING METHOD

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 246 days.

(21) Appl. No.: 13/094,319

(22) Filed: Apr. 26, 2011

(65) Prior Publication Data

US 2011/0268226 A1    Nov. 3, 2011

(30) Foreign Application Priority Data

Apr. 30, 2010 (JP) ................. 2010-105759

(51) Int. Cl.
  *H04K 1/02* (2006.01)
(52) U.S. Cl.
  USPC .......................... 375/297; 375/295; 375/296
(58) Field of Classification Search
  USPC ............. 375/295, 296, 297, 316; 330/10, 149
  See application file for complete search history.

(56) References Cited

U.S. PATENT DOCUMENTS

| | | | |
|---|---|---|---|
| 7,098,734 B2 | 8/2006 | Hongo et al. | |
| 7,486,744 B2 | 2/2009 | Shako et al. | |
| 2005/0008096 A1 | 1/2005 | Iwasaki et al. | |
| 2008/0129379 A1* | 6/2008 | Copeland ...................... | 330/149 |

FOREIGN PATENT DOCUMENTS

| | | |
|---|---|---|
| JP | 2005-033632 A | 2/2005 |
| JP | 2005-101908 A | 4/2005 |
| JP | 4308163 | 8/2009 |
| WO | WO-2005/124995 | 12/2005 |

OTHER PUBLICATIONS

Ding, Lei et al., "A Robust Digital Baseband Predistorter Constructed Using Memory Polynomials," IEEE Transactions on Communications, vol. 52, No. 1, Jan. 2004, pp. 159-165.
Kim, J. et al., "Digital Predistortion of Wideband Signals Based on Power Amplifier Model with Memory," Electronics Letters, vol. 37, No. 23, Nov. 8, 2001, pp. 1417-1418.
Mathews, V. J. et al., "Adaptive Polynomial Filters," IEEE SP Magazine, Jul. 1991, pp. 10-26.
Extended European Search Report dated Sep. 1, 2011 for corresponding European Application No. 11164270.8.

* cited by examiner

*Primary Examiner* — Dhaval Patel
(74) *Attorney, Agent, or Firm* — Fujitsu Patent Center

(57) ABSTRACT

A memory effect canceller includes a sample obtaining section that obtains a plurality of discrete-time samples of a transmission signal supplied to a power amplifier that amplifies a transmission signal, a signal generation section that generates a correction signal that is a weighted linear combination, using given weighting coefficients, of partial derivatives of a transfer function of the power amplifier, wherein the transfer function has been defined in advance with a plurality of discrete-time samples as input variables, and wherein the partial derivatives are based on the discrete-time samples obtained by the sample obtaining section at respective times, and a signal correction section that corrects an output signal of the power amplifier based on the correction signal.

6 Claims, 5 Drawing Sheets

MEMORY EFFECT CANCELLER, TRANSMITTER, AND MEMORY EFFECT CANCELLING METHOD

CROSS-REFERENCE TO RELATED APPLICATION

This application is based upon and claims the benefit of priority of the prior Japanese Patent Application No. 2010-105759, filed on Apr. 30, 2010, the entire contents of which are incorporated herein by reference.

FIELD

Embodiments described herein relate to memory effect cancellers for power amplifiers that amplify transmission signals, transmitters using the memory effect cancellers, and memory effect cancelling method.

BACKGROUND

To increase the efficiency of power amplifiers in radio frequency transmitters, the power amplifiers are frequently operated in a nonlinear region. However, such an operation method causes high-level inter-modulation distortion (IMD) to be generated, resulting in an increase in leakage power between neighboring channels. This is specifically noticeable in orthogonal frequency division multiplexing (OFDM) in which a peak-to-average power ratio (PAPR) is large. Further, since constellation (position in the complex plane of a signal) in modulation of a signal is distorted due to the nonlinearity of power amplifiers, an error vector magnitude (EVM) is deteriorated, resulting in an increase in bit error rate (BER).

Digital pre-distortion (DPD) is suggested as a method for improving the nonlinear characteristics of power amplifiers. For example, in the case of adaptive pre-distortion, which is one of the pre-distortion methods, in consideration of the nonlinearity of a power amplifier an input signal is multiplied in advance by a compensation coefficient that represents the characteristics that are the inverse of those of the nonlinearity, thereby making the input signal prior to amplification be subjected to pre-distortion processing. When the compensated input signal is amplified by the power amplifier, the characteristics (inverse characteristics described above) given to the input signal are cancelled out by the nonlinearity of the power amplifier, allowing the power amplifier to have linear output characteristics. Digital pre-distortion is a reliable method for linearization of power amplifiers in terms of efficiency and cost.

SUMMARY

According to an aspect of the embodiments discussed herein, a memory effect canceller includes a sample obtaining section that obtains a plurality of discrete-time samples of a transmission signal supplied to a power amplifier that amplifies a transmission signal, a signal generation section that generates a correction signal that is a weighted linear combination, using given weighting coefficients, of partial derivatives of a transfer function of the power amplifier, wherein the transfer function has been defined in advance with a plurality of discrete-time samples as input variables, and wherein the partial derivatives are based on the discrete-time samples obtained by the sample obtaining section at respective times, and a signal correction section that corrects an output signal of the power amplifier based on the correction signal.

Additional objects and advantages of the embodiments will be set forth in part in the description which follows, and in part will be obvious from the description, or may be learned by practice of the embodiments. The object and advantages of the embodiments will be realized and attained by means of the elements and combinations particularly pointed out in the appended claims.

It is to be understood that both the foregoing summary description and the following detailed description are exemplary and explanatory and are not restrictive of the embodiments, as claimed.

DESCRIPTION OF EMBODIMENTS

Regarding the embodiments discussed herein, the following observations are made.

Digital pre-distortion has a problem in that a memory effect of a power amplifier is generated as the bandwidth of a transmission signal increases. The performance of digital pre-distortion in which the memory effect has not been taken into consideration, may considerably decrease with increasing bandwidth of an input signal.

Figure 1:
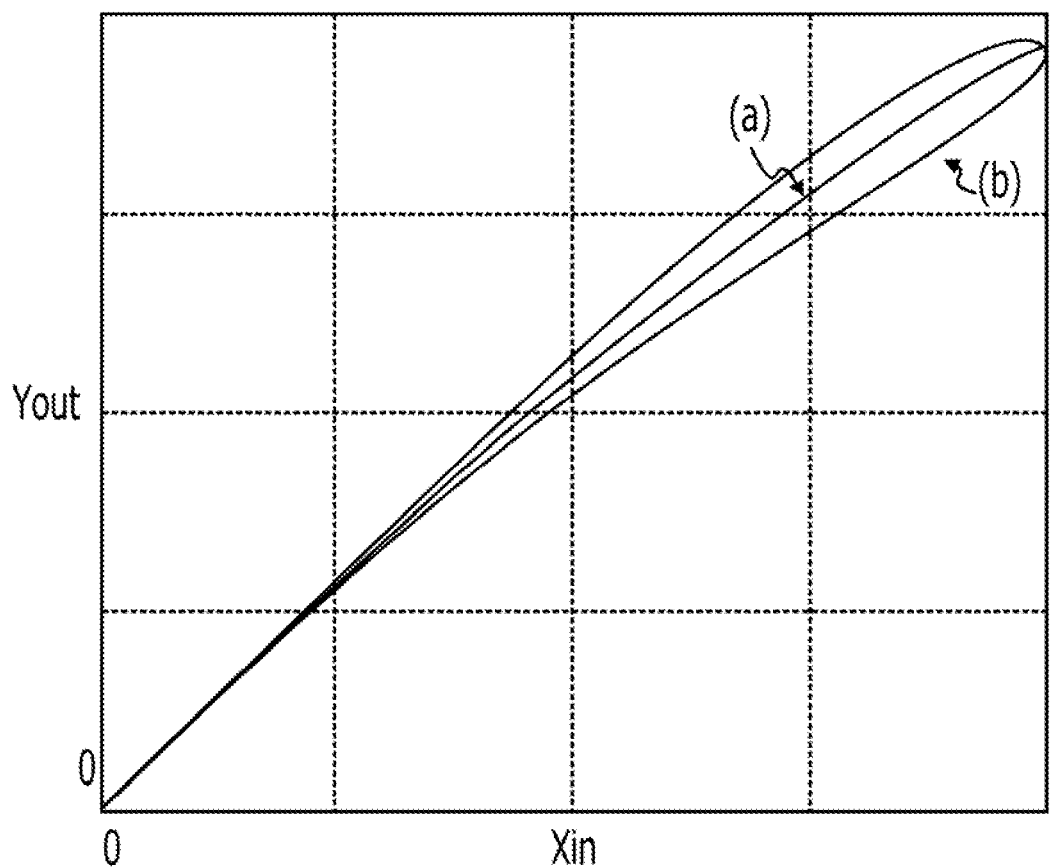
FIG. 1 illustrates the relationship between the amplitude levels of an input signal and an output signal.

In general, the influence of the memory effect of a power amplifier is seen in the AM-AM characteristics and AM-PM characteristics which are the input output characteristics of the power amplifier. For example, FIG. 1 illustrates the relationship between the amplitude level of an input signal Xin and the amplitude level of an output signal Yout (AM-AM characteristics), where (a) shows the AM-AM characteristics of a power amplifier having no memory effect and (b) shows the AM-AM characteristics of a power amplifier having a memory effect. As illustrated by (a) in FIG. 1, a power amplifier having no memory effect also has nonlinear characteristics, in which the amplitude level of the output signal is distorted, in a region where the input signal amplitude level is high. As illustrated by (b) in FIG. 1, a power amplifier having a memory effect has hysteresis characteristics in addition to nonlinear characteristics. That is, in a power amplifier having a memory effect, the amplitude level of the output signal Yout at a certain time depends not only on the input signal Xin at this time but also on the input signal Xin prior to this time.

A method using a Volterra series is an example of a method of modeling the nonlinear input output characteristics of a power amplifier taking into consideration the hysteresis characteristics due to a memory effect. An input output characteristics model (Volterra model) using the Volterra series is represented by polynomial approximation as shown by the following Equation (1), for example. Note that in Equation (1), $x(n)$ and $y(n)$ are respectively a discrete-time input signal and a discrete-time output signal, and $h_1(q)$ and $h_2(q_1, q_2)$ are coefficients as Volterra kernels. Equation (1) below shows that, when Q is an index indicating the magnitude of a memory effect, as Q becomes larger an output signal at a given time depends on more samples of an input signal prior to the given time. The case of Q=0 corresponds to a memoryless power amplifier. Q and the hysteresis width illustrated by (b) in FIG. 1 have a relationship in which they are equivalent to each other.

$$y(n) = \sum_{q=0}^{Q} h_1(q)x(n-q) + \sum_{q_1,q_2=0}^{Q} h_2(q_1, q_2)x(n-q_1)x(n-q_2) \quad (1)$$

Figure 2:
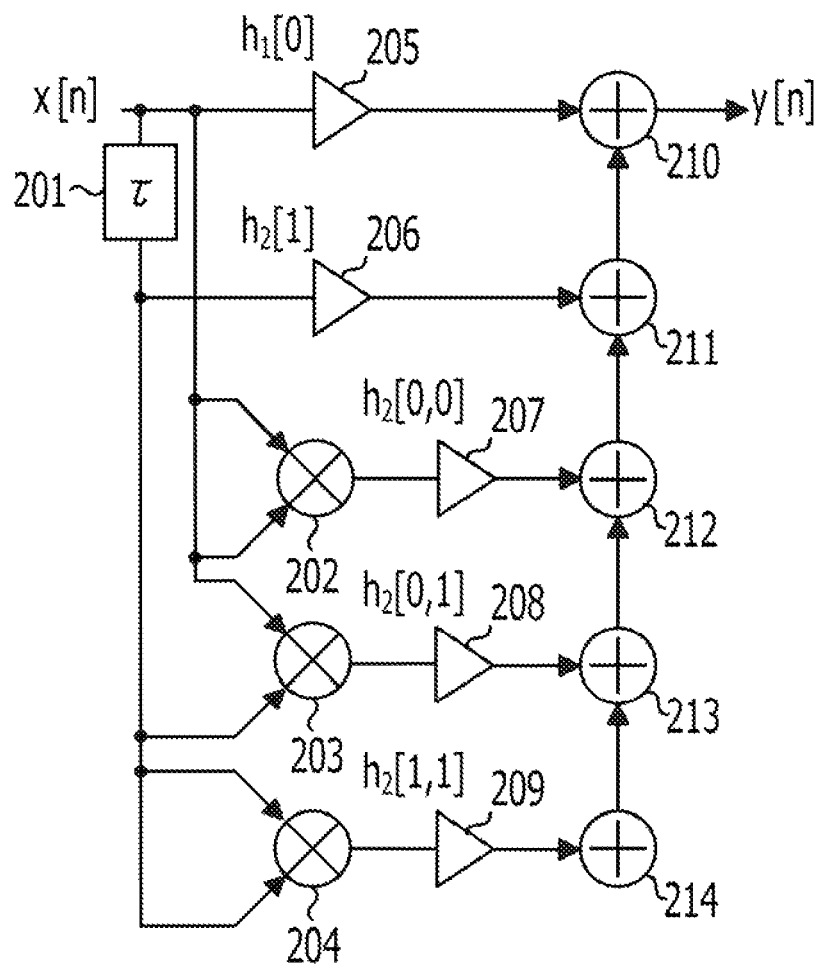
FIG. 2 is a circuit diagram of an exemplary Volterra filter.

An example of a circuit based on Equation (1) described above is a circuit illustrated in FIG. 2. In FIG. 2, x[n] is a discrete-time input signal and y[n] is a discrete-time output signal. The Volterra filter illustrated in FIG. 2 includes a delay element (τ) 201 for the input signal x[n], multipliers 202 to 204, amplifiers 205 to 209 that perform amplification in accordance with the above-described coefficients ($h_1[0]$, $h_1[1], h_2[0,0], h_2[0,1],$ and $h_2[1,1]$ in FIG. 2), and adders 210 to 214.

The low-order Volterra model shown by Equation (1) is only an example. It is known that when K is a value indicating the degree of the nonlinearity in a general Volterra model, the number of undefined coefficients yet to be computed increases with an order of $(Q+1)^K$.

Figure 3:
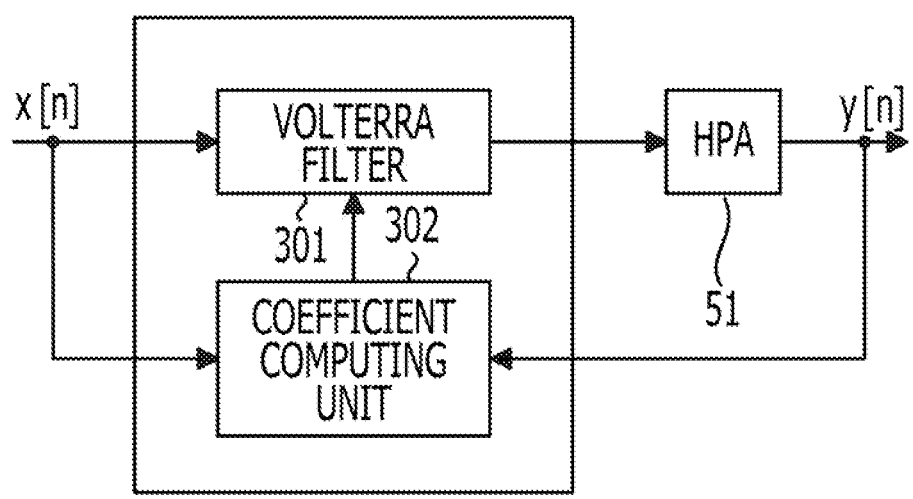
FIG. 3 illustrates a memory effect canceller that includes a Volterra filter and a coefficient computing unit.

For example, referring to FIG. 3, supposing the case in which a memory effect canceller includes a Volterra filter 301 and a coefficient computing unit 302, the coefficients of the Volterra model are computed in the coefficient computing unit 302 through feedback of the output signal y[n] of a power amplifier (HPA: high-power amplifier) 51. The Volterra filter 301 is a digital filter that performs signal processing on the input signal x[n], using the coefficients computed by the coefficient computing unit 302, in such a manner as to cancel out the memory effect of the power amplifier. In the coefficient computing unit 302, the amount of computation exponentially increases with increasing Q.

The increase in the computation amount described above has a considerably larger influence in the case where the memory effect canceller illustrated in FIG. 3 is built into DPD which uses a least mean square (LMS)-based algorithm. In other words, when polynomial approximation, such as a Volterra model, is built into DPD which uses an LMS-based algorithm, the amount of computation exponentially increases with increasing Q. This may cause a problem in that the algorithm does not converge, resulting in an unstable operation. On the other hand, when Q is set to a small value, coefficients in which the memory effect is sufficiently reflected cannot be set, and hence, the memory effect of the power amplifier is not sufficiently compensated for.

Hereinafter, an embodiment of a memory effect canceller for cancelling out the memory effect of a power amplifier that amplifies an RF signal of a radio frequency transmitter to a desired level is described with reference to FIG. 4.

Figure 4:
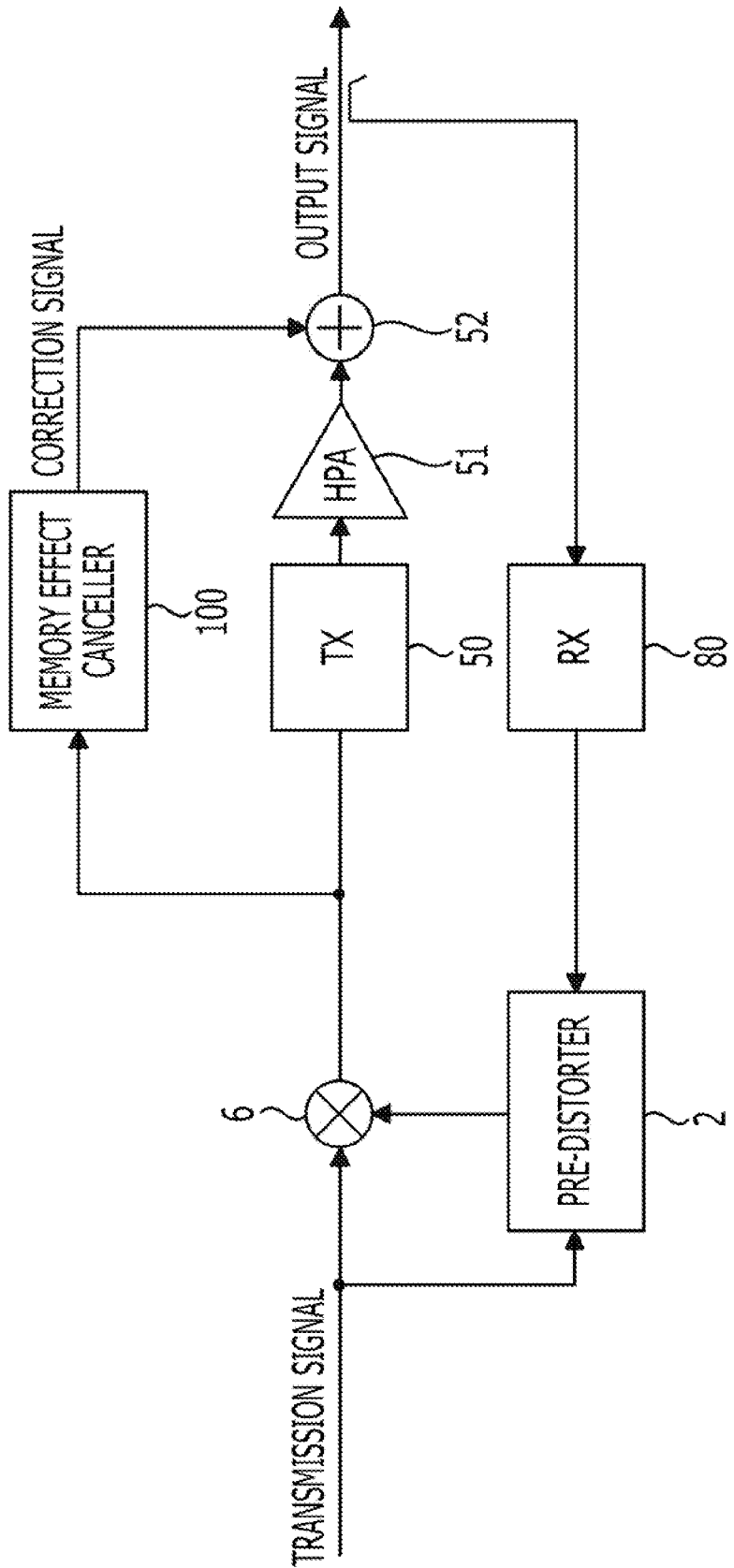
FIG. 4 is a block diagram of a schematic configuration of a radio frequency transmitter to which a memory effect canceller of an embodiment is applied.

FIG. 4 is a block diagram of a schematic configuration of a radio frequency transmitter to which a memory effect canceller 100 of the embodiment is applied.

Referring to FIG. 4, this radio frequency transmitter includes a pre-distorter 2, a mixer 6, a signal conversion unit (TX) 50, a power amplifier (HPA: high-power amplifier) 51, an adder 52, a signal conversion unit (RX) 80, and the memory effect canceller 100. In this radio frequency transmitter, to lessen the operation load for compensating the power amplifier 51, the pre-distorter 2 that compensates for the nonlinearity of the power amplifier 51 and the memory effect canceller 100 for compensating for the memory effect of the power amplifier 51 are separately provided.

Referring to FIG. 4, the signal conversion unit 80 demodulates an output signal (RF signal) of the radio frequency transmitter using orthogonal detection to convert it into a baseband signal, and converts an analog signal to a digital signal to generate a digital baseband signal. This baseband digital signal is fed back to the pre-distorter 2.

The pre-distorter 2 computes distortion compensation coefficients representing the inverse characteristics of the nonlinearity (distortion) of the power amplifier 51 based on the input signal (digital baseband signal) and a signal (feedback signal) fed back from the signal conversion unit 80. At this time, the pre-distorter 2 compares the transmission signal prior to distortion compensation and the feedback signal from the signal conversion unit 80 based on adaptive signal processing using an LMS algorithm, computes the distortion compensation coefficients so as to make the error be zero, and successively updates the coefficients. The input signal is multiplied by the distortion compensation coefficients using the mixer 6, whereby the input signal is subjected to pre-distortion processing. Note that digital pre-distortion using an LMS algorithm has been disclosed in many patent literatures including Japanese Patent No. 4308163, and the detailed description thereof is omitted here.

The signal conversion unit 50 performs digital-to-analog conversion on the transmission signal (output signal of the mixer 6) having been subjected to the pre-distortion processing, and performs orthogonal modulation to generate an RF signal. This RF signal is supplied to the power amplifier 51.

The transmission signal (output signal of the mixer 6) having been subjected to the pre-distortion processing is also input to the memory effect canceller 100 so as to suppress the memory effect of the power amplifier 51. The memory effect canceller 100 successively generates a correction signal for suppressing the memory effect of the power amplifier 51 and supplies it to the adder 52. The adder 52 adds the correction signal from the memory effect canceller 100 to the RF signal amplified by the power amplifier 51 to successively generate the RF output signal which has been compensated for the memory effect of the power amplifier 51.

An exemplary configuration of the memory effect canceller 100 will now be described with reference to FIG. 5.

Figure 5:
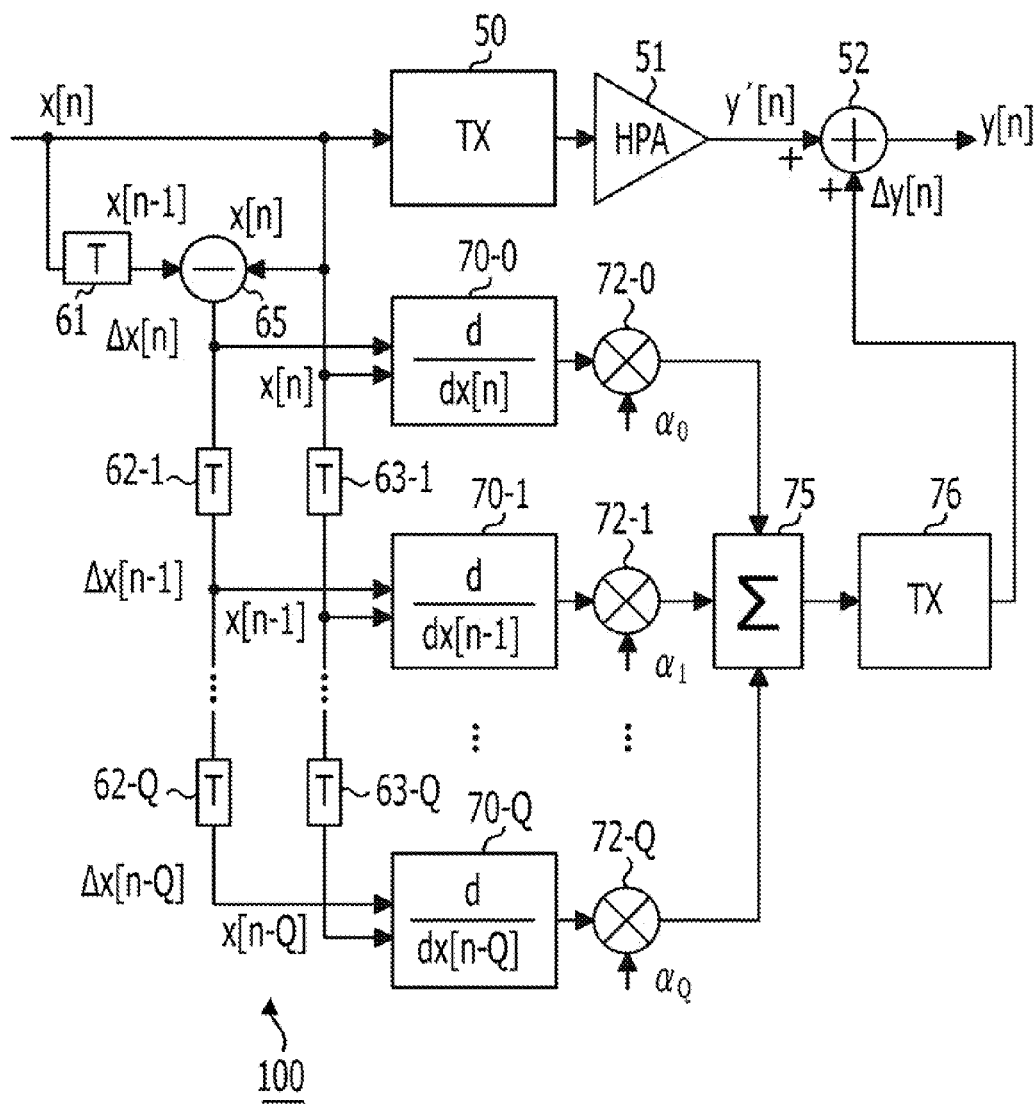
FIG. 5 illustrates an exemplary circuit configuration of the memory effect canceller of the embodiment.

Referring to FIG. 5, x[n] represents a digital baseband signal (transmission signal subsequent to the pre-distortion processing) obtained from the mixer 6 (refer to FIG. 4) as a discrete-time signal. An output signal y'[n] of the power amplifier 51 is a signal on which cancelling out of the memory effect of the power amplifier 51 has not been performed. A correction signal Δy[n] obtained by the memory effect canceller 100 is added to y'[n], whereby the output signal y[n] of the power amplifier 51 in which the memory effect has been cancelled out is obtained.

The output signal y'[n] of the power amplifier including the memory effect depends not only on the current input signal given as a transmission signal but also on the past input signal. Hence, the correction signal Δy[n] for the output signal is represented by Δy[n]=F{x[n], x[n−1], . . . , x[n−Q]}, where the current sample x[n] of the transmission signal and one or more past samples x[n], x[n−1], . . . , x[n−Q] are input parameters and F is an appropriate transfer function. For example, the transfer function F representing the power amplifier may be represented by a low-order Volterra model (in this case, the variables are only x[n] and x[n−1]), where K=3, Q=1.

Hence, the memory effect canceller 100 of the embodiment generates, as the correction signal Δy[n], a signal which is a weighted linear combination of the partial derivatives of the known transfer function F of the power amplifier, where given weight coefficients are used for the weighting, and the derivatives are obtained based on samples at respective times. That is, the correction signal $\Delta y[n]$ is given by Equation (2) below.

$$\Delta y[n] = \alpha_0 \frac{dF\{x[n], x[n-1], \ldots\}}{dx[n]} + \alpha_1 \frac{dF\{x[n], x[n-1], \ldots\}}{dx[n-1]} + \ldots \quad (2)$$

The memory effect canceller 100 illustrated in FIG. 5 is configured to generate the correction signal $\Delta y[n]$ represented by Equation (2) above.

Referring again to FIG. 5, the memory effect canceller 100 includes a delay unit 61 (first delay unit), delay units 62-1 to 62-Q (second delay unit), delay units 63-1 to 63-Q (first delay unit), a subtracter 65, computing units 70-0 to 70-Q, multipliers 72-0 to 72-Q, an adder 75, and a signal conversion unit 76. FIG. 5 also illustrates the signal conversion unit 50, the power amplifier 51, and the adder 52, in addition to the memory effect canceller 100. In the embodiment, since the output signal y[n] in which the memory effect has been cancelled out is generated through the operation of the adder 52, the adder 52 may be considered to be part of the memory effect canceller 100.

The delay unit 61, the delay units 62-1 to 62-Q, the delay units 63-1 to 63-Q, and the subtracter 65 make up a sample obtaining unit. The computing units 70-0 to 70-Q, the multipliers 72-0 to 72-Q, the adder 75, and the signal conversion unit 76 make up a signal generation unit. The adder 52 makes up a signal correction unit.

Referring to FIG. 5, the operations of respective units of the memory effect canceller 100 will be described below.

The delay unit 61 generates sample x[n−1] which is sample x[n] of the current transmission signal delayed by one sample period. The subtracter 65 subtracts sample x[n−1] from sample x[n] to generate sample $\Delta x[n]$ of a difference signal.

The delay unit 62-1 generates sample $\Delta x[n-1]$ which is sample $\Delta x[n]$ delayed by one sample period. Similarly, the delay units 62-2 to 62-Q generate samples $\Delta x[n-2]$ to $\Delta x[n-Q]$ which are samples of the difference signal delayed by one sample period in sequence. The delay unit 63-1 generates sample x[n−1] which is sample x[n] delayed by one sample period. Similarly, the delay units 63-2 to 63-Q generate samples x[n−2] to x[n−Q] which are samples of the transmission signal delayed by one sample period in sequence.

The computing unit 70-0 computes a partial derivative of the known transfer function F of the power amplifier 51 using the samples at the current time, based on sample x[n] of the transmission signal and sample $\Delta x[n]$ of the difference signal. Similarly, the computing units 70-1 to 70-Q compute partial derivatives of the known transfer function F of the power amplifier 51 using the samples at respective times, based on samples x[n−1] to x[n−Q] of the transmission signal and samples $\Delta x[n-1]$ to $\Delta x[n-Q]$ of the difference signal. The partial derivatives obtained by the computing units 70-0 to 70-Q correspond to the respective terms in Equation (2) without the weighting coefficients $\alpha_0, \alpha_1, \ldots$.

The multipliers 72-0 to 72-Q multiply signals, indicating derivatives obtained by the computing units 70-0 to 70-Q, by the respective weighting coefficients $\alpha_0$ to $\alpha_Q$. The adder 75 adds all the signals obtained by the multipliers 72-0 to 72-Q. Thereby, a baseband correction signal (digital signal) is obtained.

The signal conversion unit 76 converts the digital signal obtained by the adder 75 into an analog signal and performs orthogonal conversion to convert the analog signal into a signal in a radio frequency band. The signal obtained by the signal conversion unit 76 is supplied to the adder 52 as the correction signal $\Delta y[n]$ of the memory effect canceller 100.

Referring to FIG. 5, y'[n] is a signal which has been obtained by converting a digital baseband signal (after having been subjected to pre-distortion processing) obtained by the mixer 6 (refer to FIG. 4) into an analog signal and then into a signal in a radio frequency band through the signal conversion unit 50, and further subjecting the signal to power amplification performed by the power amplifier 51. That is, as described above, y'[n] is a signal in which the memory effect of the power amplifier 51 has not been cancelled out. In the memory effect canceller 100 of the embodiment, the output signal y[n] in which the memory effect has been cancelled out is obtained by adding the correction signal $\Delta y[n]$ to y'[n] thus obtained.

Note that the weighting coefficients $\alpha_0$ to $\alpha_Q$ have been set in advance within a range of from 0 to 1, for example. In correspondence with the orthogonal signal (I, Q) of the input signal, a complex number coefficient, in other words, a real number component and an imaginary number component, separately, may be set. A preferable example of weighting coefficient settings may be $\alpha_0=0$ and $\alpha_1=1$ for the case where a low-order Volterra model with K=3 and Q=1 is used as the transfer function F of the power amplifier 51. With this example of weighting coefficient settings, computer results showed that the memory effect of the power amplifier 51 may be sufficiently suppressed. That is, it was determined that the width of the hysteresis in the input output characteristics of the power amplifier 51 due to a memory effect is considerably reduced.

In addition, the inventor performed simulation of a two-tone test to measure the level of inter-modulation distortion (IMD). According to the results, it was determined that an allowance for a decrease in power level measured in the two-tone test was approximately 3 to 4 dB in the radio frequency transmitter provided with only DPD, but the allowance for a decrease in power level described above reached at least 10 dB in the radio frequency transmitter (with the configuration illustrated in FIG. 4) provided with the memory effect canceller 100 according to the embodiment in addition to DPD.

In the memory effect canceller 100 according to the embodiment, an increase in the amount of computation when the order (that is, the number of samples: Q+1) of the transfer function F used as a model of the power amplifier is proportional to Q. This is because, for computation of a correction signal, computation results based on the samples of a transmission signal and the samples of a difference signal are only linearly combined. Consequently, an exponential increase, such as that with $(Q+1)^K$, in computation amount with an increase in degree does not occur.

In the memory effect canceller 100 according to the embodiment, a memory effect canceller for compensating for the nonlinear characteristics of a power amplifier may be provided separately from a pre-distorter for pre-distortion processing, as illustrated in FIG. 4. That is, since the memory effect canceller is not built into the pre-distorter, processing for compensating for the nonlinear characteristics and processing for suppressing the memory effect are distributed, whereby the computation load of the whole radio frequency transmitter is lowered.

According to the embodiments discussed herein, an increase in the computation amount at the time of compensating for the memory effect of the power amplifier may be suppressed.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments have been described in detail, it should be understood that the various changes, substitutions, and alterations could be made hereto without departing from the spirit and scope of the invention.

What is claimed is:

1. A memory effect canceller comprising:
a sample obtaining section that obtains a plurality of discrete-time samples of a transmission signal supplied to a power amplifier that amplifies a transmission signal;
a signal generation section that generates a correction signal that is a weighted linear combination, using given weighting coefficients, of partial derivatives of a transfer function of the power amplifier, wherein the transfer function has been defined in advance with a plurality of discrete-time samples as input variables, and wherein the partial derivatives are based on the discrete-time samples obtained by the sample obtaining section at respective times; and
a signal correction section that corrects an output signal of the power amplifier by adding the correction signal to the output signal of the power amplifier,
wherein the signal generation section includes
a plurality of first delay sections that delay the plurality of discrete-time samples in sequence,
a subtracter that computes difference values between neighboring samples among the plurality of discrete-time samples,
a plurality of second delay sections that delay the difference values computed by the subtracter in sequence,
a plurality of computing sections that compute derivatives of the transfer function using samples at respective times based on the outputs of the first and second delay sections,
a plurality of multipliers that multiply derivatives, computed by the computing sections, respectively by the given weighting coefficients, and
an adder that adds the multiplication results obtained by the plurality of the multipliers.

2. The memory effect canceller according to claim 1, wherein the correction signal is converted into a signal in a radio frequency band prior to being added to the output signal of the power amplifier.

3. A transmitter comprising:
a power amplifier that amplifies a transmission signal;
a pre-distorter that performs pre-distortion processing on the transmission signal to compensate for nonlinear characteristics of the power amplifier based on a feedback signal fed back from the output side of the power amplifier, and outputs the transmission signal to the power amplifier; and
a memory effect canceller that suppresses a memory effect of the power amplifier based on the transmission signal having been subjected to the pre-distortion processing performed by the pre-distorter,
wherein the memory effect canceller is configured to
obtain a plurality of discrete-time samples of a transmission signal supplied to the power amplifier,
generate a correction signal that is a weighted linear combination, using given weighting coefficients, of partial derivatives of a transfer function of the power amplifier, wherein the transfer function has been defined in advance with a plurality of discrete-time samples as input variables, and wherein the partial derivatives are based on the discrete-time samples obtained by the sample obtaining section at respective times,
correct an output signal of the power amplifier by adding the correction signal to the output signal of the power amplifier,
delay the plurality of discrete-time samples in sequence,
compute difference values between neighboring samples among the plurality of discrete-time samples,
delay the computed difference values in sequence,
compute derivatives of the transfer function using samples at respective times based on the outputs of the first and second delay sections,
multiply the computed derivatives respectively by the given weighting coefficients, and
add the multiplication results obtained by multiplying the computed derivatives respectively by the given weighting coefficients.

4. The transmitter according to claim 3, wherein the correction signal is converted into a signal in a radio frequency band prior to being added to the output signal of the power amplifier.

5. A memory effect cancelling method comprising:
obtaining a plurality of discrete-time samples of a transmission signal supplied to a power amplifier that amplifies the transmission signal;
generating a correction signal that is a weighted linear combination, using given weighting coefficients, of partial derivatives of a transfer function of the power amplifier, wherein the transfer function has been defined in advance with a plurality of discrete-time samples as input variables, and wherein the partial derivatives are based on the discrete-time samples at respective times; and
correcting an output signal of the power amplifier by adding the correction signal to the output signal of the power amplifier,
wherein generating the correction signal includes
first delaying the plurality of discrete-time samples in sequence,
first computing difference values between neighboring samples among the plurality of discrete-time samples,
second delaying the difference values computed in sequence,
second computing derivatives of the transfer function using samples at respective times based on the outputs of the first and second delaying,
multiplying derivatives, computed by the second computing, respectively by the given weighting coefficients, and
adding the multiplication results obtained by the multiplying.

6. The memory effect cancelling method according to claim 5, wherein the correction signal is converted into a signal in a radio frequency band prior to being added to the output signal of the power amplifier.

* * * * *